United States Patent [19]
Allen et al.

[11] Patent Number: 5,055,439
[45] Date of Patent: Oct. 8, 1991

[54] PHOTOACID GENERATING COMPOSITION AND SENSITIZER THEREFOR

[75] Inventors: Robert D. Allen, San Jose; William D. Hinsberg, III., Fremont, both of Calif.; Logan L. Simpson, Austin, Tex.; Robert J. Twieg, San Jose; Gregory M. Wallraff, San Jose, Calif.; Carlton G. Willson, San Jose, Calif.

[73] Assignee: International Business Machines Corporation, Armonk, N.Y.

[21] Appl. No.: 458,048

[22] Filed: Dec. 27, 1989

[51] Int. Cl.$^5$ .............................................. B01J 31/02
[52] U.S. Cl. .................................... 502/158; 502/150; 502/162; 502/168; 502/172; 502/169
[58] Field of Search ............... 502/150, 158, 172, 162, 502/168, 169

[56] References Cited

U.S. PATENT DOCUMENTS

| | | | |
|---|---|---|---|
| 4,496,041 | 5/1984 | Nearly | 204/158.14 |
| 4,502,930 | 3/1985 | Yumoto et al. | 204/157.68 |
| 4,563,438 | 1/1986 | Berner et al. | 502/172 |
| 4,604,452 | 8/1986 | Shimp | 502/172 |

OTHER PUBLICATIONS

CA 108 (4): 28835y, 1988.
CA 84 (5): 30762b, 1976.
CA 107 (12): 106010w, 1987.
CA 108 (8): 65125n, 1987.
CA 80(12): 65450t, 1974.
CA 107 (7): 58625b, 1987.
CA 99 (26): 222155n, 1983.
CA 106 (24): 205020k, 1987.
CA 100 (22): 182537u, 1984.
CA 103 (20): 1690315, 1985.
CA 105 (20): 180820k, 1986.
CA 96 (1): 63374u, 1982.
CA 81 (12): 70547e, 1974.
CA 105 (3): 24078u, 1985.

*Primary Examiner*—Patrick P. Garvin
*Assistant Examiner*—E. D. Irzinski
*Attorney, Agent, or Firm*—Charles D. Gunter, Jr.

[57] ABSTRACT

A composition including an initiator which generates acid upon exposure to radiation in the presence of a sensitizer. The composition may be mixed with an acid sensitive polymer or prepolymer to make a visible light or laser imageable photoresist. The sensitizer has phenylethynyl and methoxy substituents which, when properly positioned, allow it to utilize all of the visible argon ion laser lines.

6 Claims, 2 Drawing Sheets

UV-visible spectrum of 1,8-DMBA in Quatrex 3710 Epoxy. Thin film.

UV-visible spectrum of 1,8-DMBA in Quatrex 3710 Epoxy. Thin film.

UV-Visible spectra of 1-methoxy BPEA(——) and 2-methoxy BPEA(—·—) CH₃CN solvent.

UV-Visible spectra of 1,5-Dichloro BPEA(——) and 1,5-Dimethoxy BPEA(----). Thin film.

PHOTOACID GENERATING COMPOSITION AND SENSITIZER THEREFOR

BACKGROUND OF THE INVENTION

1. Technical Field

The present invention relates generally to mixtures of certain polymers and photoacid generators used in resist compositions and specifically to the photosensitization of aromatic iodonium compounds for visible light or laser direct imageable photoresists.

2. Description Of The Prior Art

Fabrication of printed circuit boards by Laser Direct Imaging (LDI) offers a number of advantages over conventional exposure technologies. These include reduced defects, faster engineering changes of circuit design and material and labor savings resulting from the elimination of photomasks. The current generation of direct imaging tools rely upon argon ion lasers which emit in the visible region of the spectrum. The practical application of LDI technology requires the development of new resist systems since conventional ultraviolet sensitive photoresists are virtually inactive at longer wavelengths.

In pursuit of these objectives, several resist vendors have modified their dry film acrylate resists by the addition of sensitizers active at visible wavelengths. This approach has met with a number of problems in trying to fulfill todays technological requirements and does not appear capable of meeting future needs. The presently available resists are prohibitively expensive for many applications, i.e., 4-6 times the cost of corresponding UV resists in some cases, with little prospect of significant price reductions in the future Furthermore, the use of low energy (long wavelength) sensitizers often results in a decreased thermal stability and shelf life of the resist Generally these systems exhibit a strong oxygen sensitivity which precludes their use in high resolution applications. Additionally, the problem of oxygen inhibition makes the use of liquid apply methodology impractical since the oxygen diffusion barrier normally provided by the dry film cover sheet would be absent.

An alternative approach which overcomes many of the above noted problems inherent in radical cross-linking systems involves the use of resists based on acid catalyzed chemistries (e.g. polymerization, depolymerization, side chain cleavage, etc.). Such systems are described in, e.g., In Polymers in Electronics, Davidson T. Ed., ACS Symposium Series 242, American Chemical Society, Washington, D.C., 1984, p.11, H. Ito, C. G. Willson. Systems of this type are capable of high resolution, i.e., submicron in the case of semiconductor applications. Since they are oxygen insensitive they can be applied in liquid form as thin films. This is an important advantage, providing the potential for better resolution, lower cost and improved adhesion.

Despite these advantages, the development of such resists for LDI applications requiring high photospeeds has been impeded by the absence of an efficient photosensitizer/photoinitiator system. The use of onium (e.g. triphenylsulfonium and diphenyliodonium) salts as photoinitiators for photoacid generation is well known and is described by S. P. Pappas in *J. Imaging Technol.*, 11, 146 (1985). The photosensitization at ultraviolet, and to a more limited extent, visible wavelengths has been reported, Crivello et al, *J. Polym. Sci. Polym. Chem. Ed.*, 16, 2441 (1978); Crivello et al, ibid., 17, 1059 (1979); Saeva, ACS *PMSE Preprint*, 61, 72 (1989); U.S. Pat. No. 4,250,053 (Smith); U.S. Pat. No. 3,729,313 (Smith); and U.S. Pat. No. 4,069,054 (Smith), although efficient sensitization becomes increasingly difficult at longer wavelengths. The current initiator systems known to us have a number of disadvantages which make them unsuitable in acid sensitive resists. Most of the visible sensitizers reported for diphenyliodonium salts bear amino substituents and are used in free radical or epoxy systems wherein the presence of such basic functionality does not pose a problem and where low solubility is not as great a concern since high sensitizer concentrations are not generally required. Other argon laser cationic cross-linking systems have been reported but they suffer from shelf-life problems and are hindered by an inability to harvest all of the laser light, Ichimura et al, *J. Applied Polymer Sci.*, 34, 2747 (1987). In short, none of the presently available systems have the qualities required of a good sensitizer for acid catalyzed systems for laser direct imaging.

A need exists, therefore, for a photosensitizer/initiator system having the required solubility and other properties necessary for practical use and whose photochemical and photophysical parameters have been tailored to the output of the argon ion laser while maintaining functional compatability with acid catalyzed processes. Such a system will allow the design and development of photoresists based on acid catalyzed chemistry for laser direct imaging applications.

SUMMARY OF THE INVENTION

The photosensitizer/initiator system of the invention comprises an aromatic iodonium salt having associated therewith a sensitizer of the formula:

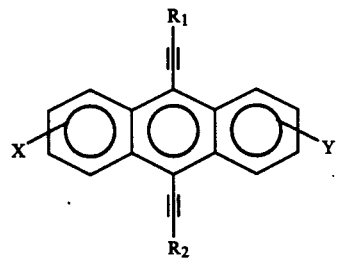

where $R_1$, $R_2$, X and Y are non-basic substituents selected from the group consisting of alkyl, alkoxy, trialkylsilyl, aromatic and substituted aromatics having about 4 to 20 carbon atoms.

Most preferably, the photosensitizer/initiator system of the invention comprises an aromatic iodonium salt having associated therewith a sensitizer comprising 1,8-dimethoxy-9,10-bis(phenylethynyl)anthracene (1,8 DMBA). The photosensitizer/initiator system may be combined with a suitable polymer to produce a visible light or laser direct imageable photoresist composition.

DETAILED DESCRIPTION OF THE INVENTION

Figure 1:
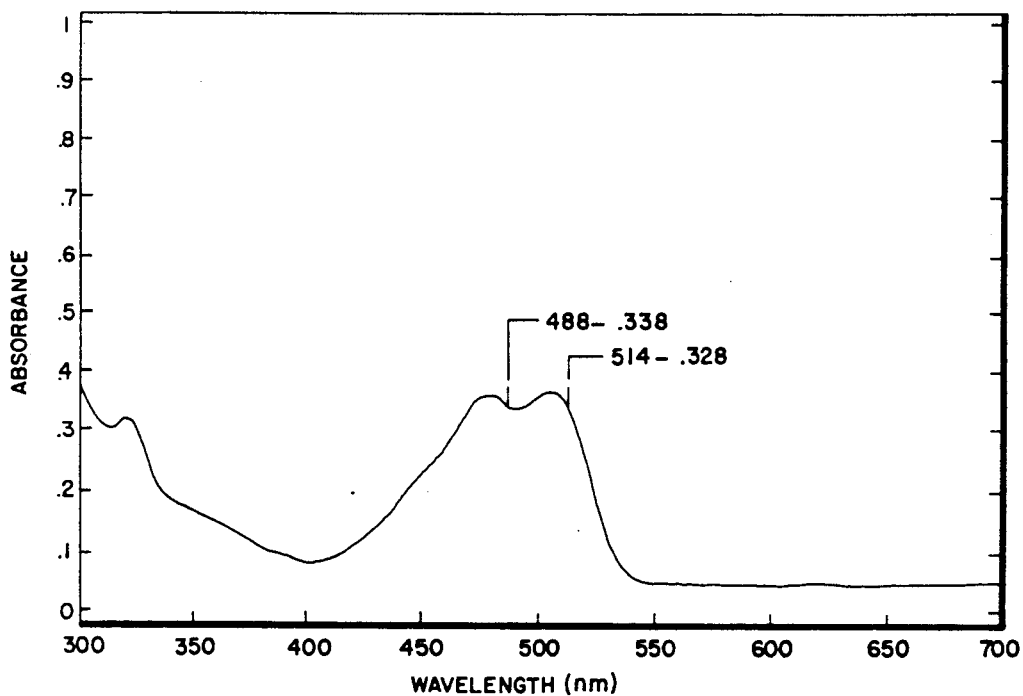
FIG. 1 is an absorption spectrum of 1,8-DMBA in epoxy.

According to the present invention, acid generating initiators (e.g. diaryliodonium salts) may be combined with a sensitizer in a suitable polymer or other material to produce a resist composition sensitive to visible wavelength radiation.

The photoacid generators used in the present invention are compounds which produce strong acids upon exposure to radiation in the presence of appropriate sensitizers. The most preferred photoacid generators or initiators are substituted and unsubstituted diaryliodonium salts. Aromatic iodonium salts which can be sensitized in accordance with this invention thus include those having the formulae:

wherein

Ar$^1$ and Ar$^2$ are aromatic groups having 4 to 20 carbon atoms and are preferably selected from phenyl, naphthyl, thienyl, and furanyl groups; and Q$^-$ is any anion, but preferably is an anion selected from tetrafluoroborate, hexafluorophosphate, hexafluoroarsenate, hexafluoroantimonate, trifluoromethane sulfonate or trifluoroacetate.

Amongst the useful iodonium salts are particularly included
diphenyliodonium hexafluoroarsenate
diphenyliodonium hexafluoroantimonate
diphenyliodonium hexafluorophosphate
diphenyliodonium trifluoroacetate
4-trifluoromethylphenylphenyliodonium tetrafluoroborate
ditolyliodonium hexafluorophosphate
di(4-methoxyphenyl)iodonium hexafluoroantimonate
diphenyliodonium trifluoromethane sulfonate
di(t-butylphenyl) iodonium hexafluoroantimonate
di(t-butylphenyl) iodonium trifluoromethane sulfonate
(4-methylphenyl)phenyliodonium tetrafluoroborate
di-(2,4-dimethylphenyl)iodonium hexafluoroantimonate
di-(4-t-butylphenyl)iodonium hexafluoroantimonate
2,2'-diphenyliodonium hexafluorophosphate.

The sensitizer component of the invention is used to sensitize the acid generator (e.g. iodonium salt) toward the visible spectrum. The preferred sensitizer used with diaryliodonium salts to sensitize the salts to longer wavelengths have the formula:

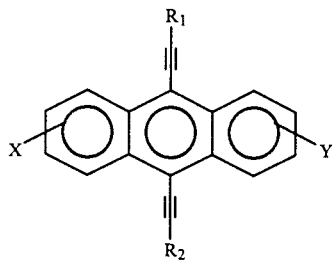

where:

X and Y are non-basic substituents selected from the group consisting of, but not limited to, alkyl, alkoxy, aromatic and substituted aromatics having about 4–20 carbon atoms; and R$_1$ and R$_2$ are independently selected from the group consisting of alkyl, trialkylsilyl, aromatic and substituted aromatic groups having about 4 to 20 carbon atoms.

Preferably R$_1$ and R$_2$ are independently selected from the group consisting of trimethylsilyl, phenyl and substituted aromatics of the formula:

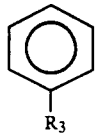

where
R$_3$ is OMe and CH$_3$; and
X and Y are preferably

—O—R$_4$ where R$_4$ is alkyl, most preferably OMe.

Exemplary sensitizers, thus include:
9,10-bis(trimethylsilylethynyl)anthracene;
9,10-bis(phenylethynyl)anthracene;
9,10-bis(n-butylethynyl)anthracene; and
1,8-dimethoxy-9,10-bis(phenylethynyl)anthracene.

The most preferred sensitizer useful for sensitization of the acid generator toward visible argon laser wavelengths (about 488 to 514 nm) is 1,8-dimethoxy-9,10-bis(phenylethynyl)anthracene, referred to herein as 1,8-DMBA, and having the formula:

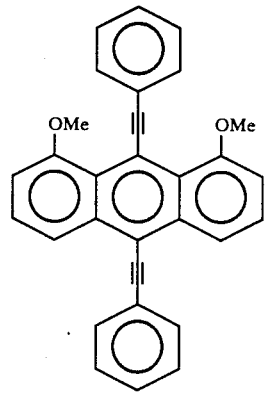

The preferred sensitizer, 1,8-DMBA was synthesized as follows:

STEP 1

A 5-liter round-bottom flask equipped with an overhead stirrer, thermocouple, and reflux condenser with a nitrogen/vacuum outlet was charged with 1200 mL of tetrahydrofuran, 138.5 grams of 1,8-dichloroanthraquinone, and 35.6 grams of 18-crown-6. This solution was deoxygenated, stirred under nitrogen, and heated until a clear solution was obtained A solution of 165.0 grams of sodium methoxide in 1000 mL of methanol (prepared from sodium metal) was then added over a period of 30 min. The reaction mixture was heated at reflux for 24 hours, at which time TLC (silica gel, 1:1 EtOAc/toluene) indicated that the reaction was complete. The reaction was cooled overnight in an ice bath and the crystallized product isolated by filtration (82% crude yield). This material was recrystallized from 1000 mL of toluene to afford 1,8-dimethoxyanthraquinone in an overall yield of 50%.

STEP 2

A 2-liter round-bottom flask equipped with an overhead stirrer, thermocouple, and nitrogen inlet was charged with 330 mL of dry dioxane and 58.9 grams of lithium phenylacetylide. To this was added 54.9 grams of 1,8-dimethoxyanthraquinone (DMAQ) portionwise from a round bottomed flask through a flexible neck, protecting the reaction from air. The reaction was slightly exothermic. Dry dimethylformamide was added next, rinsing the flask and neck used to facilitate addition of the DMAQ. This mixture was stirred at 50° C. for four hours, then cooled to room temperature. The reaction can be monitored using TLC by noting the disappearance of the starting material and the appearance of two product spots.

A solution of 112.8 grams of stannous chloride dihydrate in 225 mL of dimethylformamide was then added dropwise, and the resulting solution stirred for about 15 hours while protected from light. TLC is useful here to monitor the disappearance of spots formed during the previous step.

To the reaction mixture was added 33.5 grams of glacial acetic acid, followed by 225 grams of 8N sulfuric acid. After stirring for several minutes, the orange precipitate was collected by filtration, washed with 500 mL of cold methanol, then dried in a vacuum oven at 60° C. overnight to give the product, 1,8-dimethoxy-9,10-bis(phenylethynyl)anthracene as a red crystalline solid, mp 178°-180° C. (Yield 70%).

The acid generating initiator and sensitizer described above can be combined in an acid sensitive substance such as a suitable polymer or other material, to provide a novel resist composition. Acid-sensitive substances useful in the practice of the present invention include, epoxies, poly(tert-butyl methacrylate), poly(tert-butoxycarbonyloxystyrene), poly(phthaldehyde), condensation polymers of bisphenol A with carbonyloxy derivatives of tertiary diols, copolymers and terpolymers of the above, and the bis(tert-butoxycarbonyl) derivative of bisphenol A.

Acid sensitive polymers of the above type will be familiar to those skilled in the art and are readily prepared using known techniques. For instance, methacrylate and acrylate homo-,co-,ter-, tetra-, etc., polymers are synthesized by free radical solution polymerization. The choice of polymerization solvent is governed by factors such as solubility of the monomers, the nature of the initiators and formed polymer, boiling point, cost, etc. A variety of Azo and peroxide initiators can be used to initiate the polymerization. Choice of monomers is dependent on the desired polymer properties. In a typical synthesis, a reactor is charged with solvent (THF, MEK, etc.) and the desired monomers such that the formed polymer, assuming 100% conversion, attains a final concentration of 10 to 50% (wt/wt). The initiator is then charged (typically AIBN or BPO), at levels from 0.05% to 1.0% (vs. monomer), depending on the desired molecular weight The system is sparged with nitrogen to remove oxygen. The polymerization is typically run at 60 to 80 degrees centigrade for 10 to 24 hours. The polymer is isolated by precipitation into a nonsolvent (hydrocarbon or water), and collected and dried at elevated temperatures under vacuum.

The following non-limiting examples are intended to further illustrate the resists of the invention:

EXAMPLE I

The most preferred sensitizer, 1,8 DMBA has been used in a number of different chemically amplified resist systems and epoxy systems. For example a resist based on 3710 QUATREX epoxy resin (Dow Chemical) containing 10% diphenyliodonium hexafluoroantimonate and 2.5% 1,8-DMBA was coated (by doctor blade) on a copper panel to a thickness of 10 $\mu$m from a cyclohexanone solution. The panel was dried and imagewise exposed at a dose of 18 mJ/cm$^2$ with a 300 watt xenon lamp equipped with a 514.5 nm interference filter. Following post exposure bake at 100° C. (2 minutes) the panel was developed with anisole.

EXAMPLE II

In another example, the sensitizer was exercised in a resist formulation which features acid-catalyzed side group deprotection as the imaging mechanism. To 100 parts t-butyl carbonate-protected poly(vinyl phenol) was added 10 parts of acid generator bis(tert-butylphenyl) iodonium trifluoromethane sulfonate and 3 parts of sensitizer 1,8-dimethoxy-9,10-bis(phenylethynyl)anthracene. These resist components were dissolved in cyclohexanone to yield a 20% (w/w) solution. Films were formed on silicon wafers by spin coating the resist solution, followed by drying for 3 minutes at 120° C. The resist was exposed with 8 mJ/cm$^2$ of 514 nm filtered light, then post-expose baked at 120° C. for 1 minute. Positive-tone images were developed with an isopropanol spray.

An invention has been provided with several advantages. The most preferred compound named in this invention, 1,8 DMBA has properties which make it uniquely suited as a sensitizer for LDI applications employing an Argon ion laser. These characteristics are listed below.

(1) 1,8-DMBA can utilize all of the visible laser lines.

Figure 2:
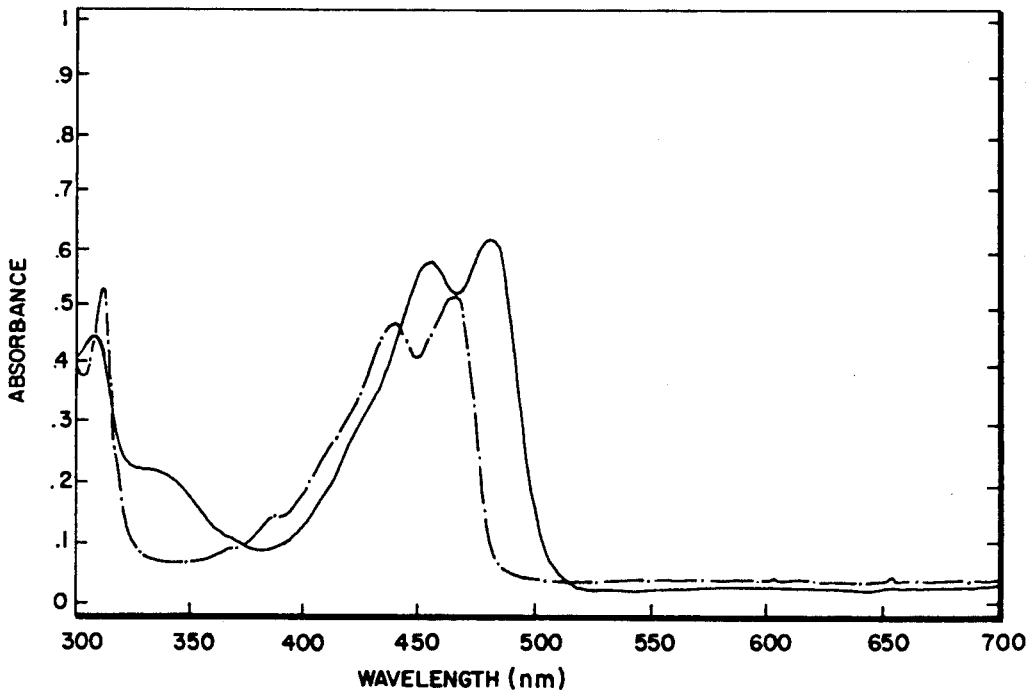
FIG. 2 compares the absorption spectrum of 1-methoxy bis(phenylethynyl)anthracene and 2-methoxy bis(phenylethynyl)anthracene.
Figure 3:
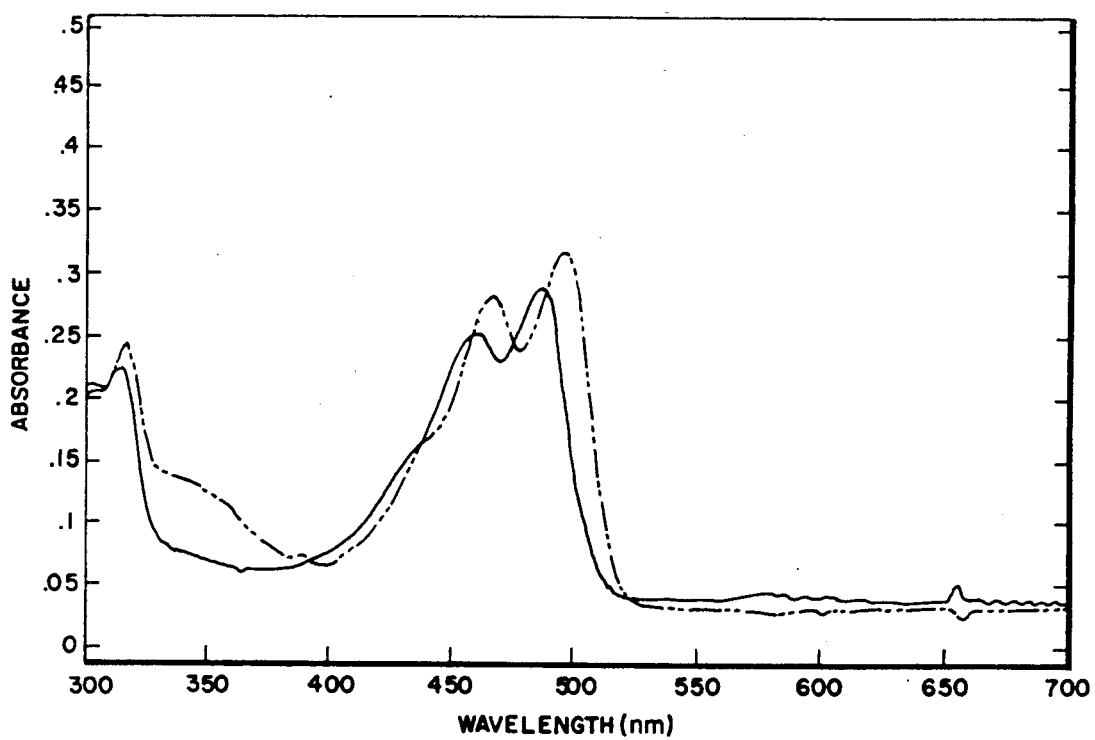
FIG. 3 compares the absorption spectrum of 1,5 dichloro bis(phenylethynyl)anthracene and 1,5-dimethoxy bis(phenylethynyl)anthracene.

When run in the multiline mode, an Argon ion laser emits from 457.9 nm to 514.5 nm, with the strongest lines at 488 and 514.5 nm. The absorption spectrum of a thin film of QUATREX 3710 epoxy containing 1,8-DMBA is shown in FIG. 1. Note that the absorbance at 488 and 514 nm is approximately equal and quite similar to a laser output (488 nm–1.5 watts, 515.5–2.0 watts for a 5 watt laser). The ability to effectively capture the 514.5 line is an important advantage of this material over the prior art. The large bathochromic shift of 1,8-DMBA when compared to 9,10 diphenylanthracene is theorized to be due mainly to the presence of the actylenic groups in the chromophore. The absorption spectrum can be "fine-tuned" by properly positioning the methoxy substituents. The effects of changing the substitution position can be seen in FIG. 2. Thus, the optimized absorption of 1,8-DMBA is due to both the presence and the position of the phenylethynyl and the methoxy substituents.

(2) The absorption spectrum has a sharp, long wavelength cutoff just past 514.5 nm.

If the sensitizer has significant absorption at wavelengths much longer than 500 nm the resist will be sensitive to red light. This complicates the implementation of these systems in the manufacturing environment.

(3) 1,8-DMBA is soluble in polar organic solvents.

Poor solubility is a particular problem with long wavelength sensitizers. In the case of aromatic hydrocarbons the polycyclic structures require for absorption at ~500 nm (e.g. pentacene) are usually quite insoluble.

This is also true for ionic dye sensitizers such as acridine orange. The unexpectedly good solubility of 1,8-DMBA (up to 5% by weight in the copolymer system described above) appears to be due both to the phenylethynyl and the dimethoxy substituents.

(4) 1,8-DMBA does not possess basic (dialkylamino) functionality.

The most widely used method of red-shifting the optical absorption of aromatic compounds involves the addition of dialkylamino residues to the sensitizer. This substitution also serves to lower the oxidation potential and in principal should give useful sensitizers. However, due to the basicity of the amino group, the use of such compounds in resist systems which rely on Bronsted acid generation for catalytic deprotection or polymerization is not practical as basic functionality adversely affects the photo-response of the resist. This is particularly noticeable for acid catalyzed deprotection systems. The non-basic nature of 1,8-DMBA is an important advantage of this system.

While the invention has been particularly shown and described with reference to a preferred embodiment, it will be understood by those skilled in the art that various changes in form and detail may be made therein without departing from the spirit and scope of the invention.

We claim:

1. A photoacid generating composition for use in laser direct photoimaging applications, the photoacid generating composition being combinable with a suitable acid sensitive polymer to provide a photoresist composition sensitive to visible wavelength radiation, the photoacid generating composition comprising:

(a) a sensitizer having the formula;

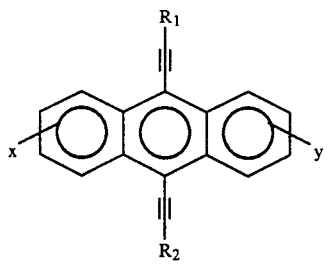

wherein $R_1$ and $R_2$ are non-basic substituents independently selected from the group consisting of alkyl, trialkylsilyl, phenyl and compounds of the formula:

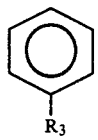

where $R_3$ is alkoxy and alkyl;
where x and y are non-basic substituents independently selected from the group consisting of alkyl and alkoxy; and (b) an initiator which generates an acid upon exposure to radiation in the presence of the above sensitizer.

2. A photoacid generating composition for use in laser direct photoimaging applications, the photoacid generating composition being combinable with a suitable acid sensitive polymer to provide a photoresist composition sensitive to visible wavelength radiation, the photoacid generating composition comprising:

(a) a sensitizer having the formula;

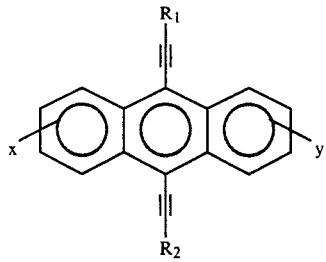

wherein $R_1$ and $R_2$ are non-basic substituents independently selected from the group consisting of trimethylsilyl, phenyl and compounds of the formula:

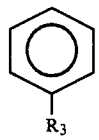

where $R_3$ is OMe and $CH_3$;
where x and y are non-basic substituents independently selected from the group consisting of:

$$O-4_4$$

where $R_4$ is alkyl having about 1 to 20 carbon atoms; and (b) an initiator which generates an acid upon exposure to radiation in the presence of the above sensitizer.

3. A photoacid generating composition for use in laser direct photoimaging applications comprising a sensitizer and an initiator which generates an acid upon exposures to radiation in the presence of the sensitizer, the photoacid generating composition being combinable with a suitable acid sensitive substance to provide a photoresist composition sensitive to visible wavelength radiation, and wherein the sensitizer is 1,8-dimethoxy-9,10-bis(phenylethynyl)anthracene.

4. The photoacid generating composition of claim 3, wherein the initiator is a diaryliodonium salt.

5. The photoacid generating composition of claim 3, wherein the initiator is diphenyliodonium hexafluoroantimonate.

6. The photoacid generating composition of claim 3, wherein the initiator is di(t-butylphenyl)iodonium trifluoromethane sulfonate.

* * * * *